(12) United States Patent
Chen

(10) Patent No.: US 6,191,478 B1
(45) Date of Patent: Feb. 20, 2001

(54) DEMOUNTABLE HEAT SPREADER AND HIGH RELIABILITY FLIP CHIP PACKAGE ASSEMBLY

(75) Inventor: Kim H Chen, Fremont, CA (US)

(73) Assignee: Agilent Technologies Inc., Palo Alto, CA (US)

( * ) Notice: Under 35 U.S.C. 154(b), the term of this patent shall be extended for 0 days.

(21) Appl. No.: 09/326,339

(22) Filed: Jun. 7, 1999

(51) Int. Cl.$^7$ .................................................. H01L 23/34
(52) U.S. Cl. ............................................................ 257/718
(58) Field of Search .................................. 287/718, 719, 287/697

(56) References Cited

U.S. PATENT DOCUMENTS

| | | | |
|---|---|---|---|
| 5,585,671 | 12/1996 | Nagesh et al. ........................ | 257/697 |
| 5,893,409 | * 4/1999 | Kohler et al. ........................ | 165/80.3 |
| 6,093,961 | * 7/2000 | McCullough ........................ | 257/718 |

* cited by examiner

Primary Examiner—Terry D. Cunningham
Assistant Examiner—Quan Tra

(57) ABSTRACT

A demountable heat spreader assembly utilizing a unique retainer frame for demountably retaining a heat spreader having a flexible thermal interface material disposed in a cavity of the heat spreader is disclosed. The retainer frame allows a substrate having a flip chip IC mounted thereon to be snapped into the retainer frame. The heat spreader also snaps into the retainer frame and is positioned in the retainer frame so that the flexible thermal interface material contacts the IC with a slight interference. The flexible thermal interface material provides effective thermal coupling between the IC and the heat spreader and loose mechanical coupling between the IC and heat spreader. Thermomechanical stress caused by heating or cooling of the IC is reduced by the loose coupling between the IC and the flexible thermal interface material. The retainer frame allows for the heat spreader and the substrate to be removed and can be made from low cost materials such a plastic.

20 Claims, 5 Drawing Sheets

DEMOUNTABLE HEAT SPREADER AND HIGH RELIABILITY FLIP CHIP PACKAGE ASSEMBLY

BACKGROUND OF THE INVENTION

The present invention relates generally to a high thermal performance and high reliability flip chip package assembly and more specifically to a high thermal performance and high reliability flip chip package assembly having a retainer frame with a demountable heat spreader.

As minimum feature sizes of integrated circuits (IC) continue to shrink and IC system performance continues to increase, the amount of waste heat generated by an IC plays a major role in determining IC reliability and the cost of packaging used to house the IC. Due to the decrease in the feature sizes more components are fabricated in the IC thereby increasing the amount of waste heat generated. Increases in system performance made possible by reduced feature sizes have given rise to higher system clock speeds. Those higher clock speeds also contribute to the waste heat generated by the IC. If the waste heat is not adequately dissipated the IC will destroy itself or the IC will later fail in an end product application such as a notebook PC, for example. The trend towards systems on a chip further exacerbates the amount of waste heat that must be removed from an IC because the heat dissipated by several IC that would normally be in separate packages are integrated into a single IC housed in one package. Removing the waste heat from an IC die often requires expensive packaging and costly manufacturing processes. As a result, package cost is a major component of the overall cost of the IC.

A high performance IC, such as a system on a chip, tends to have a high input/output interconnect count (IO). Because of the high IO count it is not always possible or desirable to position IO pads of an IC die along the edges of the die. Instead, the IO pads are arranged in an array on an interconnect side of the die. This configuration is called an area array flip chip. The flip chip is mounted on a substrate such as a multi-layer ceramic, for example. The substrate has a matching array of bonding pads. Solder bumps are placed on the IO pads of the die and the IO pads are soldered to the matching array of bonding pads by reflowing the solder bumps.

One disadvantage of the flip chip is that the backside of the die (the side opposite the interconnect side) is exposed and is not in thermal communication with the substrate. Unlike traditional wire bond mounting techniques where the backside is mechanically and thermally connected to a heat spreader that forms part of the substrate, the flip chip construction requires a separate heat spreader to be mounted on the backside. Mounting the heat spreader on the backside creates mechanical loads on the die, solder bumps, and the substrate. Those mechanical loads can cause the solder bumps to fail resulting in a defective IC. Additionally, the waste heat generated by the IC can also cause the IC to fail due to thermal mismatch between the lid, the die, the substrate, and the solder bumps.

Moreover, the heat spreader must often serve as the lid for the IC package. Subsequently, the lid must be attached to the substrate and the area between the substrate, the die, and the lid must be filled with a material that seals the area. This adds to the cost of the IC and introduces another possible failure mode for the IC due to thermal mismatch between the material used to fill the area and the die, the lid, the solder bumps, and the substrate. Additionally, another thermal mismatch occurs when the substrate containing the IC is mounted to a PC board in order for the IC to communicate with external circuits mounted on the PC board. In order to dissipate the waste heat from high performance IC, ceramic, is typically used for the substrate material. Ceramic is the material of choice due to its closer match of coefficient of thermal expansion with that of silicon, and its high thermal conductivity and mechanical strength over those of laminate materials. Typically, the ceramic substrate has secondary IO connections that are surface mounted to the PC board using a reflow solder process. However, during system operation when the IC is powered up or powered down, there is a thermomechanical interaction between the IC package assembly and the PC board due to differences in coefficients of thermal expansion of the PC board and the substrate. Mechanical stress created by the thermal mismatch can cause the secondary IO connections to fail. Furthermore, the thermomechanical interaction introduces additional mechanical stresses between the lid, the substrate, and the solder bumps that can also result in failure of the IC.

Therefore, there is a need for an IC package assembly that is low in cost, does not require expensive package materials, has high power dissipation for high-performance IC's, eliminates the need to attach the lid to the substrate, does not require a fill material between the lid and the IC die, improves reliability, and reduces thermomechanical stress between the lid and the die.

SUMMARY OF THE INVENTION

The present invention provides a demountable heat spreader assembly for efficiently removing waste heat from a high performance electronic component and for increasing reliability of the electronic component by minimizing thermal and mechanical stress created by thermally mismatched materials. This assembly eliminates any need for expensive materials and any need to mechanically couple a heat removing lid to a substrate on which the electronic component is mounted. Additionally, an assembly according to the invention is easy to manufacture and lower in cost than conventional high thermal performance IC packages.

Broadly, the present invention embodies a demountable heat spreader assembly having a heat spreader, a flexible frame to retain the heat spreader, and a substrate on which is mounted an electronic component. A cavity in the heat spreader retains a flexible thermal interface material. The frame is attached to the substrate so that the flexible thermal interface is positioned adjacent to the electronic component and is thermally coupled to the electronic component through mechanical contact with it. As the electronic component is subjected to cycles of heating and cooling, the flexible thermal interface maintains thermal communication between the electronic component and the heat spreader; however, the flexible thermal interface allows for a loose mechanical coupling between the electronic component and the flexible thermal interface so that thermal and mechanical stress are minimized and mechanical loads that would be caused by a rigid connection of the heat spreader to the electronic component are substantially reduced.

The flexible frame may be made from plastic or metal thereby reducing the cost of the package assembly. The assembly can be manufactured with fewer steps and at a lower cost than conventional high performance IC packages. The flexible frame can allow the heat spreader and the substrate to be removed from the frame, and can also allow for a secondary heat exchanger to be coupled to the heat spreader to enhance heat dissipation. Cost of the package assembly can be reduced by using a low cost heat spreader material such as aluminum, for example. Furthermore, manufacturing cost for the package assembly can be reduced by eliminating direct attachment of the heat spreader to the substrate and by eliminating the filler material between the heat spreader and the electronic component.

The demountable heat spreader assembly of the present invention reduces the number of manufacturing steps necessary to assemble the IC package, can be made from low cost materials, efficiently removes waste heat from high performance IC's, mechanically decouples the heat spreader from the IC and the substrate, can accommodate a secondary heat exchanger to enhance heat dissipation, allows for interchangeability of heat spreaders, and can be repeatedly mounted and dismounted from the substrate.

In one embodiment, the demountable heat spreader assembly includes a heat spreader having an interface surface. A cavity is disposed in the interface surface. A flexible thermal interface material is disposed in the cavity and is in thermal communication with the heat spreader. The heat spreader is adapted to be connected to a spreader side of a retainer frame. The retainer frame can include a clamp connected to a package side of the retainer frame and operative to demountably clamp a package to the package side of the retainer frame so that the package is positioned adjacent to the flexible thermal interface material.

Additionally, the retainer frame can include a spreader guide disposed on the retainer frame. The heat spreader is guided into the spreader side of the retainer frame when the heat spreader is urged against the spreader guide. A spreader key disposed on the heat spreader and shaped to complement the spreader can be used to insure that the heat spreader is coupled to the spreader side with the flexible thermal interface positioned in proper orientation with the package.

DETAILED DESCRIPTION

Figure 1B:
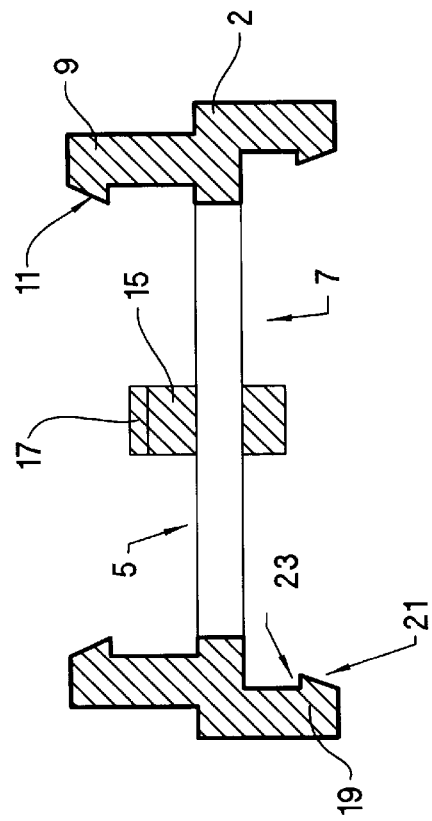
FIG. 1b is cross sectional view along line AA of FIG. 1a of a retainer frame according to the present invention.

In the following detailed description and in the several figures of the drawings, like elements are identified with like reference numbers.

As shown in the drawings for purposes of illustration, the invention is embodied in a demountable heat spreader assembly that includes a heat spreader having an interface surface with a cavity defined in the interface surface. A flexible thermal interface material is disposed in the cavity and is in thermal communication with the heat spreader. A retainer frame having a package side and a spreader side is adapted to receive the heat spreader on the spreader side. A clamp on the package side of the retainer frame is adapted to demountably clamp a package to the retainer frame so that the package is disposed adjacent to and in thermal communication with the flexible thermal interface material.

The demountable heat spreader assembly of the present invention efficiently dissipates heat from a package contained in the retainer frame while reducing thermal and mechanical stress on the package. The retainer frame is easy to manufacture, light weight, and can be made from low cost materials such as metal and plastic. Moreover, the retainer frame can be adapted to receive a wide variety of packages including electronic components and substrates having electronic components mounted thereon. Additionally, a secondary heat exchanger can be coupled to the heat spreader to enhance dissipation of waste heat from a package.

Figure 1A:
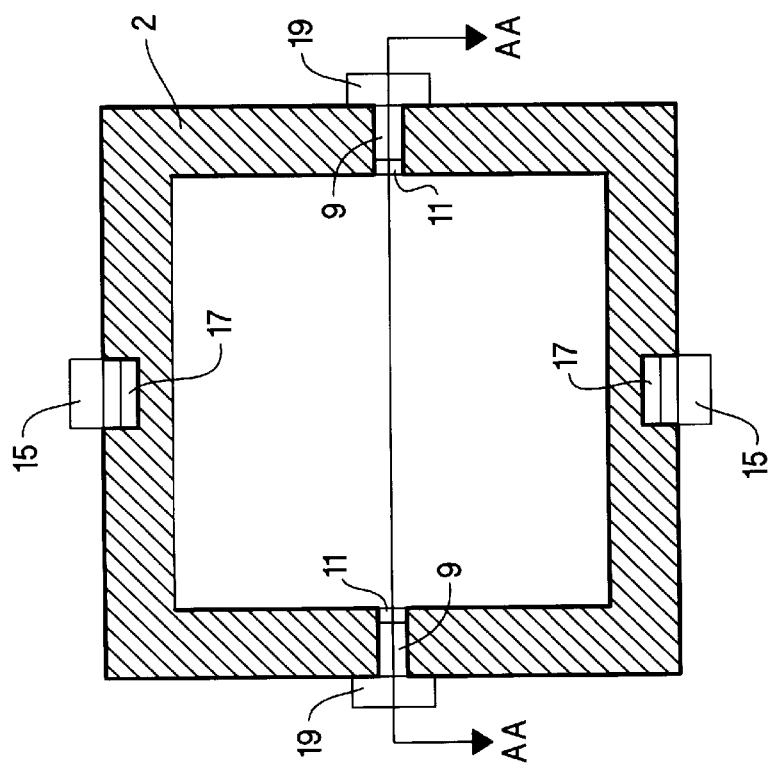
FIG. 1a is a top plan view of a spreader side of a retainer frame according to the present invention.

Referring to FIG. 1a, there is provided in accordance with the present invention a retainer frame 2. The retainer frame 2 has a spreader side 5 and a package side 7 as illustrated in FIG. 1b which is a cross-sectional view of FIG. 1a along line AA. A clamp 19 disposed on the retainer frame 2 is operative to demountably clamp a package (not shown) to be cooled to the package side 7 of the retainer frame 2. The clamp 19 can include a package wedge 21 and a package recess 23. In applications where it is desirable to remove or insert the package into the retainer frame 2, the clamp 19 should be made of a flexible material to allow for easy insertion of the package into the retainer frame 2 and to allow the clamp 19 to be opened for removal of the package from the retainer frame 2. The package wedge 21 operates to push the clamp 19 outward when the package is urged into contact with the wedge 21. The package recess 23 contains the package in the clamp 19 so that the package is securely coupled to the package side 7 of the retainer frame 2.

The retainer frame 2 and the clamp 19 can be made from a material such as plastic, metal, or polycarbonate, for example. Plastic is a preferred material because plastic is low in cost, is suitable for high volume manufacturing, and can be injection molded, for example, to form the retainer frame 2. An additional reason for using plastic for the retainer frame 2 is that plastic can be flexible and flexibility is a desirable attribute for the clamp 19. Furthermore, the retainer frame 2 and the clamp 19 can be made into a single unit using injection molding or casting, for example. The clamp 19 can be a separate component part that is connected to the retainer frame 2 using glue, welds, screws, rivets, fasteners, and the like. Other materials such as composites or carbon fiber, for example, can be used for the retainer frame 2 and the clamp 19.

It may be desirable to tailor the flexibility of the clamp 19 depending on the application. Flexibility can be tailored by the selection of the material and the dimensions of the clamp 19. In some applications it may be desirable to make the clamp 19 stiff to prevent the package from being easily removed or dislodged from the retainer frame 2. In other applications a highly flexible clamp 19 may be desirable to allow the package to be inserted and removed by hand, for example.

In another embodiment of the present invention, the package can be retained on the packaged side 7 using clips, screws, glue, welds, fasteners, and the like, for example, to couple the package to the package side 7 of the retainer frame 2.

Figure 2:
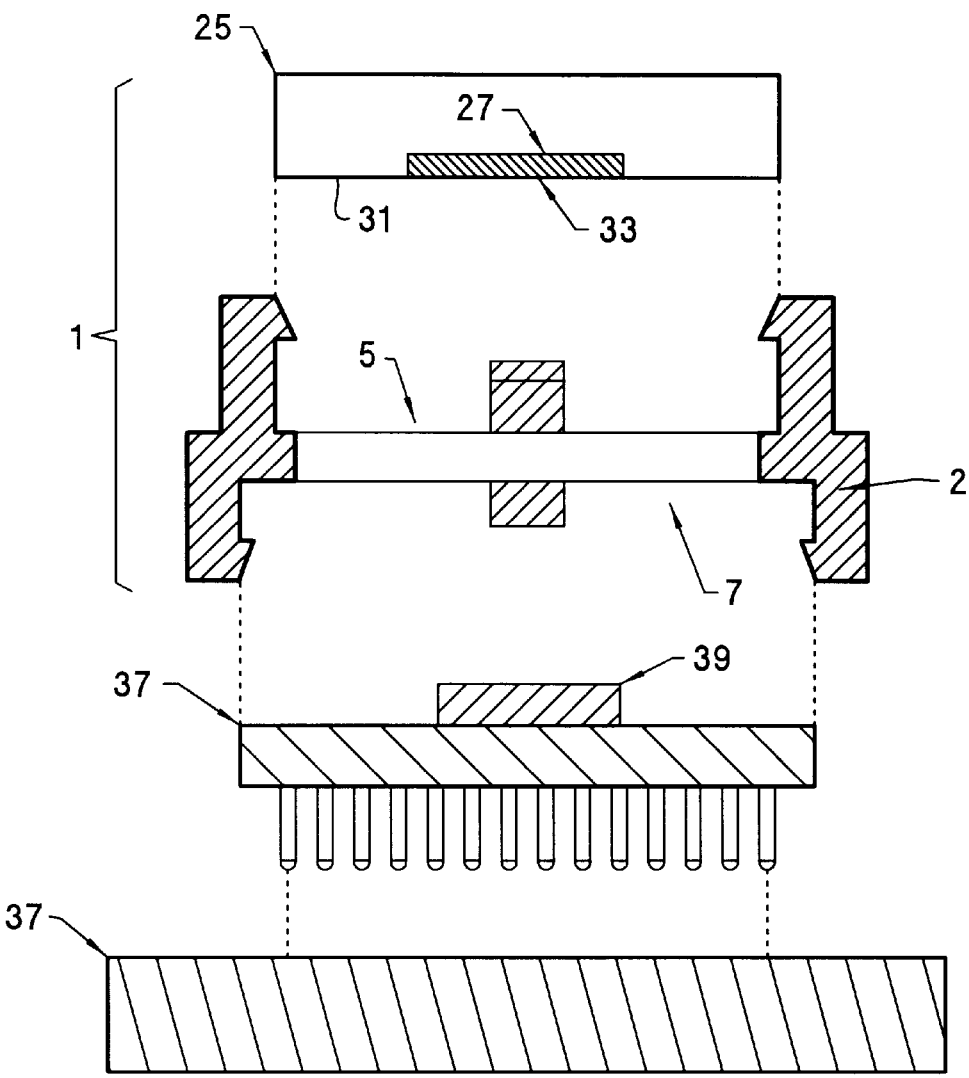
FIG. 2 is a cross-sectional view of a heat spreader and a substrate prior to connection to a retainer frame according to the present invention.

Referring to FIG. 2, there is provided in accordance with the present invention a demountable heat spreader assembly generally designated as 1. The demountable heat spreader assembly 1 includes the retainer frame 2 and a heat spreader 25 having a interface surface 31 with a cavity 27 defined in the interface surface 31. The cavity 27 is adapted to receive a flexible thermal interface material 33. The flexible thermal interface material 33 is disposed in the cavity 27 and is in thermal and mechanical communication with the heat spreader 25.

Suitable materials for the heat spreader 25 include aluminum, copper, graphite, aluminum nitride, copper tungsten alloy, and aluminum silicon carbide composite, for example. The heat spreader 25 can be made by casting, machining, stamping, or other methods know in the art. The cavity 27 can be formed by any suitable method such as milling, etching, or it can be part of the mold used for casting the heat spreader 25, for example.

Suitable materials for the flexible thermal interface material 33 include silicone, paraffin, phase transition material, graphite, and carbon fiber, for example. The flexible thermal interface material 33 can be shaped to fit the cavity 27 or it can have an application specific shape that depends on several factors such as the type of package to be cooled and the desired amount of mechanical coupling force between the package and the flexible thermal interface material 33. In some applications it may be desirable to have the flexible thermal interface material 33 extend outward of the interface surface 31 so that when the package is coupled to the retainer frame 2 a surface of the package is urged into contact with the flexible thermal interface material 33. On the other hand, in some applications the flexible thermal interface material 33 may be recessed into the cavity 27 or be flush with the interface surface 31, for example.

The heat spreader 25 is coupled to the spreader side 5 of the retainer frame 2 using any suitable method known in the art such as screws, rivets, glue, welding, fasteners, and the like, for example. Alternatively, it may be desirable to insert and remove the heat spreader 25 from the retainer frame 2. In applications where a component to be cooled can be upgraded to a higher performance component, for example, it may be necessary to use a heat spreader with higher heat dissipation capacity. The heat spreader 25 may be coupled to the spreader side 5 of the retainer frame 2 by a spreader clamp 9. The spreader clamp 9 should be flexible to allow for insertion and removal of the heat spreader 25.

The spreader clamp 9 operates in a manner similar to the clamp 19 and allows the heat spreader 25 to be demountably clamped to the spreader side 5 of the retainer frame 2. The spreader clamp 9 can include a spreader wedge 11 and a spreader recess 13. The spreader wedge 11 operates to push the spreader clamp 9 outward when the heat spreader 25 is urged into contact with the spreader wedge 11. The spreader recess 13 contains the heat spreader 25 in the spreader clamp 9 so that the heat spreader 25 is securely coupled to the spreader side 5 of the retainer frame 2. The spreader clamp 9 can be a separate component part that is connected to the retainer frame 2 using glue, welds, screws, rivets, fasteners, and the like, for example. The spreader clamp 9 can be integral to the retainer frame 2 and can be made from the same material as the retainer frame 2.

It may be desirable to tailor the flexibility of spreader clamp 9 depending on the application. Flexibility can be tailored by the selection of material and the dimensions of spreader clamp 9. In some applications it may be desirable to make the spreader clamp 9 stiff to prevent the heat spreader 25 from being easily removed or dislodged from the retainer frame 2. In other applications a highly flexible spreader clamp 9 may be desirable to allow the heat spreader 25 to be inserted and removed by hand, for example.

In one embodiment of the present invention, as illustrated in FIG. 2, a substrate 37 is adapted to be clamped to the package side 7 of the retainer frame 2. The substrate 37 includes IO interconnect 49 disposed on the substrate 37 for electrically communicating the substrate 37 to an external circuit (not shown). The substrate 37 can be mounted to a PC board (PCB) 51 that may include other electronic circuits that electrically communicate with the substrate 37 via the IO interconnect 49. Suitable materials for the substrate 37 include a PCB material or a ceramic material, for example.

Figure 3:
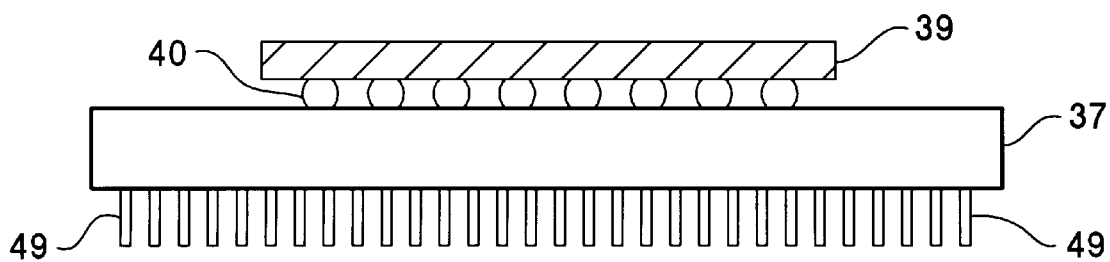
FIG. 3 is a blown up cross-sectional view of an electronic component electrically communicating with a substrate according to the present invention.

An electronic component 39 is mounted on the substrate 37 and is in electrical communication with the substrate 37. FIG. 3 illustrates in greater detail the electronic component 39 mounted on the substrate 37. An electrical connection 40 electrically communicates the electronic component 39 with the substrate 37. Any method known in the art can be used to electrically communicate the electronic component 39 with the substrate 37. For example, the electrical connection 40 can be conductive elastomer bumps or solder bumps. The electronic component 39 can be surface mounted onto the substrate 37, for example. The specific method for implementing the electrical connection 40 will depend on the application and the type of electronic component 39. For example, if the electronic component 39 is a silicon chip then soldering bumping would be a suitable method for implementing the electrical connection 40.

The electronic component 39 is normally a silicon chip or several silicon chips, but It can be a packaged IC, a multichip module, an encapsulated electronic component, a flip chip IC package, for example. Any combination of the aforementioned components can be disposed on the substrate 37. Although only one electronic component 39 is shown in FIG. 2 and in FIG. 3, the present invention is not limited to one electronic component 39 and more than one electronic component 39 can be disposed on the substrate 37.

Figure 4A:
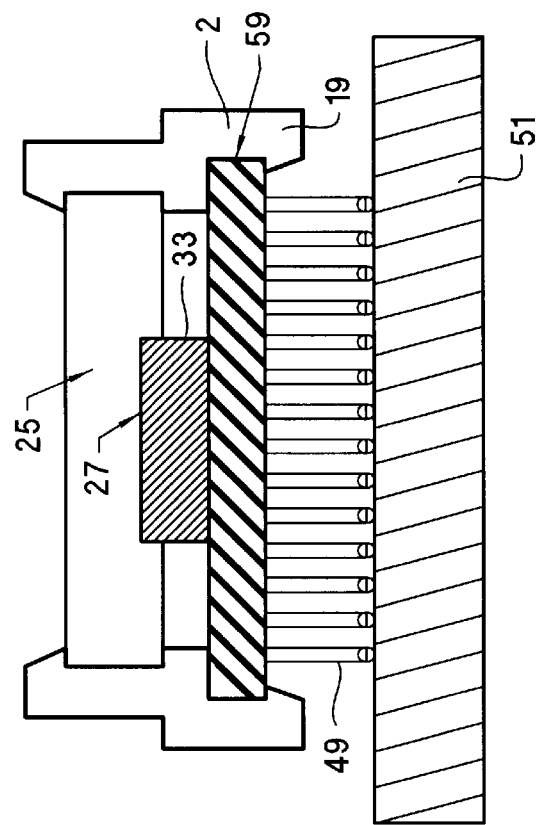
FIG. 4a is a cross-sectional view of a heat spreader and substrate positioned in a retainer frame according to the present invention.

FIG. 2 illustrates the heat spreader 25 and the substrate 37 prior to connection to the retainer frame 2. Referring to FIG. 4*a*, the heat spreader 25 is coupled to the spreader side 5 of the retainer frame 2 to form the demountable heat spreader assembly 1. The substrate 37 is then coupled to the demountable heat spreader assembly 1 so that the substrate 37 is retained on the package side 7 of the retainer frame 2 and the electronic component 39 is positioned adjacent to the flexible thermal interface material 33 and is in thermal and mechanical communication with the flexible thermal interface material 33. The substrate 37 can be retained on the package side 7 of the retainer frame 2 using clips, screws, fasteners, welds, glue, and the like, for example. Alternatively, the substrate 37 can be retained on the package side 7 of the retainer frame 2 using the clamp 19 as shown in FIG. 4*a*.

Moreover, it is important to minimize contact force between the flexible thermal interface 33 and the electronic component 39. Generally, it is desirable to have slight mechanical interference between the flexible thermal interface material 33 and the electronic component 39. Excessive contact force can create undue mechanical stress on the electronic component 39, the electrical connection 40 and the substrate 37, resulting in failure of the electronic component 39, the electrical connection 40, or the substrate 37. Therefore, thickness and material properties of the flexible thermal interface 33 must be carefully selected for each application. It is important to control the thickness of the flexible thermal interface 33 so that thermomechanical effects of the heat spreader 25 are sufficiently de-coupled from the electronic component 39 and substrate 37. The thickness of the flexible thermal interface 33 should not vary by a substantial amount as the demountable heat spreader assembly 1 is cycled from hot to cold or vice-versa. For example, if the flexible thermal interface 33 expands during heating or cooling it could create a tight coupling between the heat spreader 25 and the electronic component 39 that can result in a thermomechanical stress failure of the electronic component 39, the substrate 37, or the electrical connection 40.

Figure 4B:
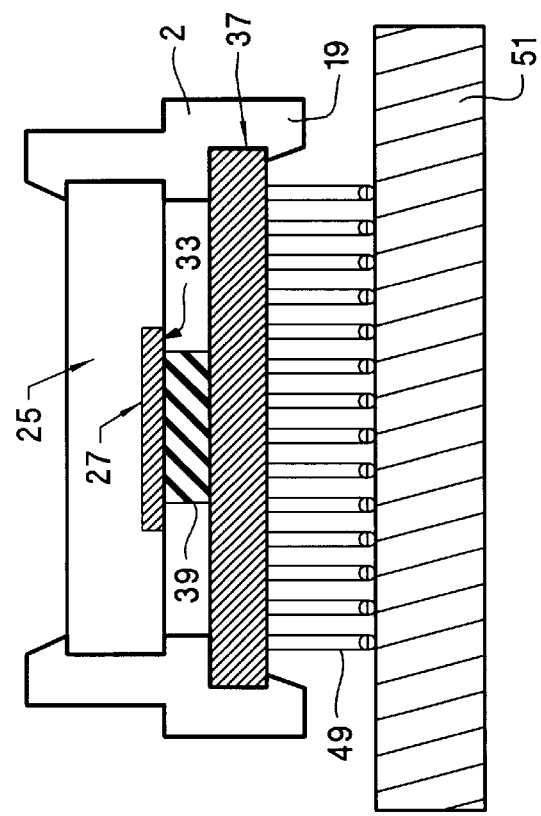
FIG. 4b is a cross-sectional view of a heat spreader and a package positioned in a retainer frame according to the present invention.

In one embodiment of the present invention as illustrated in FIG. 4b, the heat spreader 25 is coupled to the retainer frame 2 to form the demountable heat spreader assembly 1. A package 59 is clamped to the package side 7 of the retainer frame 2. The package 59 has IO interconnect 49 for electrically communicating the package 59 with an external circuit (not shown). The external circuit can be a PCB 51 having other electronic circuits mounted thereon, for example. The package 59 can be an electronic component such as a packaged IC, a multi-chip module, or encapsulated electronic components, for example. As mentioned above in reference to FIG. 4a, it is important to minimize contact force between the flexible thermal interface 33 and the package 59; therefore, in general, it is desirable to have slight mechanical interference between the flexible thermal interface material 33 and the package 59 to prevent failure of the package 59 due to mechanical stress.

The package 59 is positioned adjacent to the flexible thermal interface material 33 and is in thermal and mechanical communication with the flexible thermal interface material 33. Although the flexible thermal interface material 33 is shown extending outward of the interface surface 31, the flexible thermal interface material 33 can be recessed into the cavity 27 or it can be flush with the interface surface 31.

Figure 5:
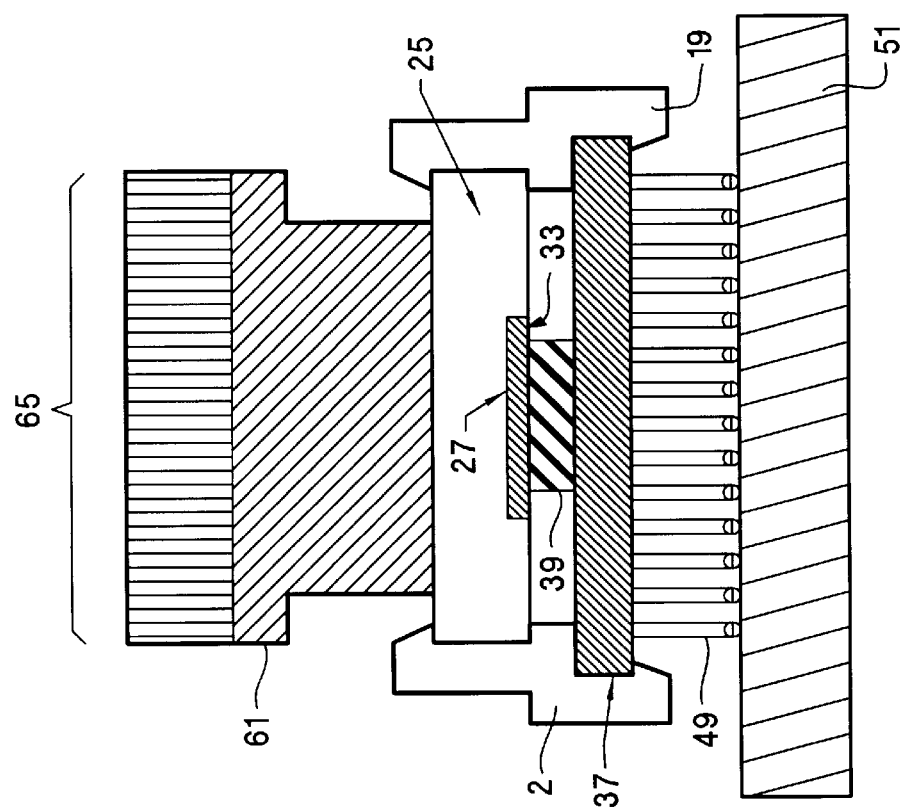
FIG. 5 is a cross-sectional view of a secondary heat exchanger coupled to a heat spreader according to the present invention.

In another embodiment of the present invention, as illustrated in FIG. 5, a secondary heat exchanger 61 is disposed on the heat spreader 25. The secondary heat exchanger 61 is in mechanical and thermal communication with the heat spreader 25. The secondary heat exchanger 61 extends the surface area available for cooling so that removal of waste heat generated by the electronic component 39 is increased over the amount of waste heat removal facilitated by using the heat spreader 25 alone. The secondary heat exchanger 61 can include cooling fins 65 to further increase the surface area of the secondary heat exchanger 61 available for waste heat removal. The secondary heat exchanger 61 can be a heat pipe, a thermoelectric cooler, a finned heat sink, cold plate, or a forced air cooled heat sink, for example. Although FIG. 5 shows the secondary heat exchanger 61 with the cooling fins 65, any heat exchanger known in the art may be used for the secondary heat exchanger 61.

Figure 6:
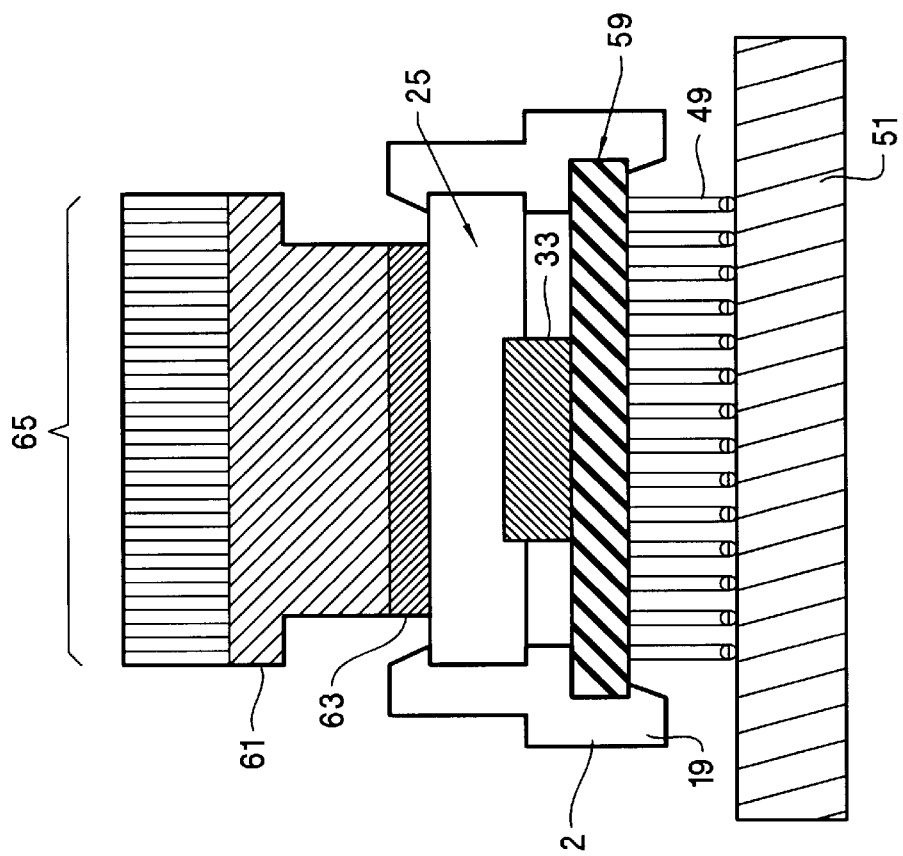
FIG. 6 is a cross-sectional view of a secondary heat exchanger coupled to a heat spreader using a thermally conductive interface according to the present invention.

In one embodiment of the present invention, as illustrated in FIG. 6, a thermally conductive interface 63 is disposed between the heat spreader 25 and the secondary heat exchanger 61. The thermally conductive interface 63 is in thermal and mechanical communication with the heat spreader 25 and the secondary heat exchanger 61 and is operative to increase thermal coupling between the heat spreader 25 and the secondary heat exchanger 61. The thermally conductive interface 63 can be useful in applications where very high power dissipation of about 25 Watts or more is required, for example. Suitable materials for the thermally conductive interface 63 include thermal paste, carbon fiber, and graphite, for example.

In another embodiment of the present invention as illustrated in FIGS. 1a, 1b, and 2, the retainer frame 2 includes a spreader guide 15 disposed on the retainer frame 2 and extending outward of the spreader side 5. The spreader guide 15 is operative to guide the heat spreader 25 into position on the spreader side 5 of the retainer frame 2. The spreader guide 15 can include a guide wedge 17 operative to engage a side of the heat spreader 25 so that as the heat spreader 25 is inserted into the retainer frame 2 the guide wedge 17 urges the heat spreader 25 into engagement with the spreader guide 15.

Figure 7:
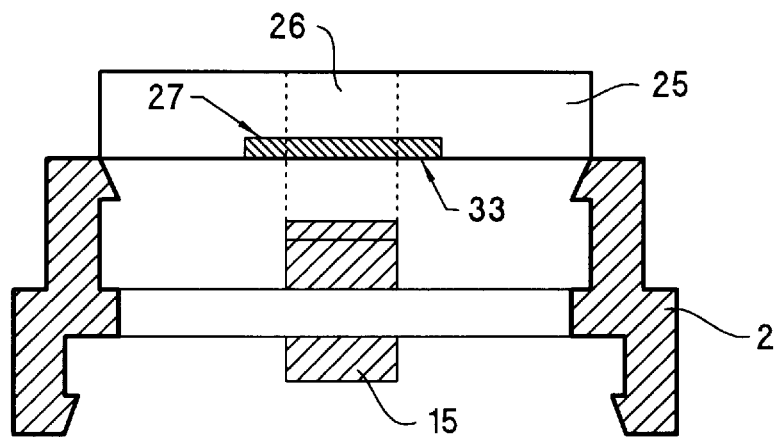
FIG. 7 is a cross-sectional view of a heat spreader having a spreader key according to the present invention.

In one embodiment of the present invention, as illustrated in FIG. 7, a spreader key 26 is disposed on the heat spreader 25. The spreader key 26 has a shape adapted to complement the spreader guide 15 The spreader key 26 allows the heat spreader 25 to be inserted into the retainer frame 2 only when the spreader key 26 is aligned With the spreader guide 15. When the heat spreader 25 is properly aligned with the spreader guide 15 and then coupled to the retainer frame 2, the position of the cavity 27 relative to the substrate 37 (not shown) or the package 59 (not shown) is fixed and allows the flexible thermal interface 33 to be consistently positioned over the electronic component 39 or the package 59. Consistent positioning of the flexible thermal interface 33 is important since the heat spreader 25 can be removed and then reinserted into the retainer frame 2. For example, if manual labor is used to insert or remove the heat spreader 25 then keying the heat spreader 25 to the retainer frame 2 can prevent incorrect placement of the heat spreader 25 in the retainer frame 2 thereby preventing the flexible thermal interface 33 from being incorrectly positioned over the electronic component 39 or the package 59.

Figure 8:
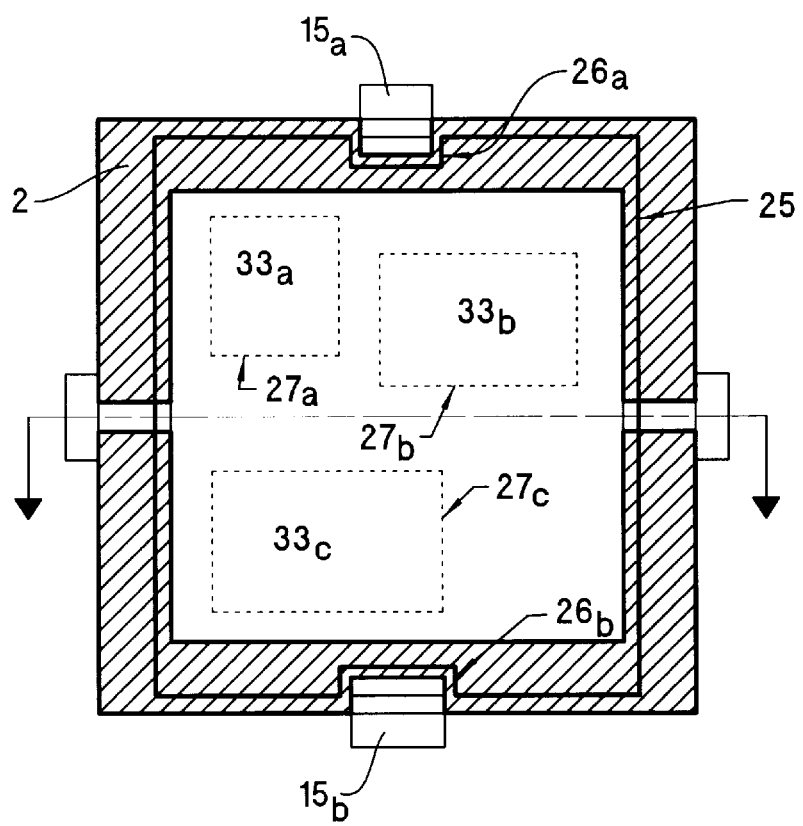
FIG. 8 is a top plan view of a spreader side of a retainer frame having a spreader guide and a heat spreader having a spreader key according to the present invention.

In another embodiment of the present invention, as illustrated in FIG. 8, the heat spreader 25 has a plurality of cavities 27a, 27b, and 27c. The thermal cavities 27a, 27b, and 27c can have the same shape or they can be shaped differently from one another. Flexible thermal interface materials 33a, 33b, and 33c are positioned in their respective cavities 27a, 27b, and 27c. The flexible thermal interface materials 33a through 33c can be made of the same material or they can be made from different materials. Spreader keys 26a and 26b align the heat spreader 25 with the retainer frame 2 so that when the heat spreader 25 is coupled to the retainer frame 2 the flexible thermal interface materials 33a through 33c are correctly positioned over the electronic components (not shown) they are intended to thermally interface with. This arrangement allows for multiple electronic components to be mounted on the substrate 37 (not shown) and the flexible thermal interface materials 33a through 33c to be customized for each of those electronic components.

Furthermore, to insure correct alignment of the flexible thermal interface materials 33a through 33c with the electronic components on the substrate 37, the heat spreader 25 can include spreader keys 26a and 26b of unequal size that match spreader guides 15a and 15b respectively. The heat spreader can be inserted into the retainer frame 2 only when the spreader key 26b is aligned with the spreader guide 15b and the spreader key 26a is aligned with the spreader guide 15a.

Although several embodiments of the present invention have been disclosed and illustrated, the invention is not limited to the specific forms or arrangements of parts so described and illustrated. The invention is only limited by the claims.

What is claimed is:

1. A demountable heat spreader assembly comprising:
   a retainer frame having a spreader side and a package side;
   a heat spreader coupled to the spreader side of the retainer frame, the heat spreader having an interface surface with a cavity defined therein;
   a flexible thermal interface disposed in the cavity and in thermal communication with the heat spreader; and
   a clamp carried by the retainer frame and operative to demountably clamp a package to the package side of the retainer frame, the package in thermal communication with the flexible thermal interface.

2. The demountable heat spreader assembly of claim 1 further comprising a spreader guide disposed on the retainer frame for guiding the heat spreader into the spreader side of the retainer frame.

3. The demountable heat spreader assembly of claim 2 further comprising:
   a spreader key disposed on the heat spreader and having a shape adapted to complement the spreader guide, the spreader key operative to allow the heat spreader to be inserted into the retainer frame only when the spreader key is aligned with the spreader guide, whereby the flexible thermal interface has a predetermined orientation with respect to the package.

4. The demountable heat spreader assembly of claim 1 and further comprising a package having IO interconnect disposed thereon for electrically communicating the package with an external circuit, the package adapted to be clamped into the package side of the retainer frame so that a surface of the package is in thermal communication with the flexible thermal interface, whereby waste heat generated by the package is dissipated by the heat spreader.

5. The demountable heat spreader assembly of claim 4, wherein the package comprises an electronic component selected from the group consisting of a silicon chip, a packaged IC, a multi-chip module, a flip-chip IC package, and an encapsulated electronic component.

6. The demountable heat spreader of claim 1 and further comprising:
   a substrate having IO interconnect disposed thereon for electrically communicating the substrate with an external circuit, the substrate adapted to be clamped into the package side of the retainer frame;
   an electronic component mounted on the substrate, the electronic component in thermal communication with the flexible thermal interface, whereby waste heat generated by the electronic component is dissipated by the heat spreader; and
   an electrical connection for electrically communicating the electronic component with the substrate.

7. The demountable heat spreader assembly of claim 6, wherein the electronic component is selected from the group consisting of a multi-chip module, a semiconductor die, an encapsulated electronic component, and a flip chip IC package.

8. The demountable heat spreader assembly of claim 1, wherein the flexible thermal interface comprises a material selected from the group consisting of silicone, paraffin, phase transition material, graphite, and carbon fiber.

9. The demountable heat spreader assembly of claim 1, wherein the heat spreader comprises a material selected from the group consisting of aluminum, copper, graphite, aluminum nitride, copper tungsten alloy, and aluminum silicon carbide composite.

10. The demountable heat spreader assembly of claim 1, wherein the retainer frame comprises a material selected from the group consisting of plastic, metal, and polycarbonate.

11. The demountable heat spreader assembly of claim 1 further comprising a secondary heat exchanger disposed on the heat spreader and in thermal communication with the heat spreader.

12. The demountable heat spreader assembly of claim 11 further comprising a thermally conductive material disposed intermediate between the heat spreader and the secondary heat exchanger, the thermally conductive material in thermal communication with the heat spreader and the secondary heat exchanger.

13. The demountable heat spreader assembly of claim 11, wherein the secondary heat exchanger is selected from the group consisting of a heat pipe, a heat sink, a finned heat sink, a thermoelectric cooler, a cold plate, and a forced air cooled heat sink.

14. A demountable heat spreader assembly comprising:
    a retainer frame having a spreader side and a package side;
    a heat spreader coupled to the spreader side of the retainer frame, the heat spreader having an interface surface with a cavity defined therein;
    a flexible thermal interface disposed in the cavity and in thermal communication with the heat spreader; and
    means disposed on the retainer frame for retaining a package on the package side of the retainer frame so that the package is in thermal communication with the flexible thermal interface.

15. The demountable heat spreader assembly of claim 14, wherein the flexible thermal interface comprises a material selected from the group consisting of silicone, paraffin, phase transition material, graphite, and carbon fiber.

16. The demountable heat spreader assembly of claim 14, wherein the heat spreader comprises a material selected from the group consisting of aluminum, copper, graphite, aluminum nitride, copper tungsten alloy, and aluminum silicon carbide composite.

17. The demountable heat spreader assembly of claim 14, wherein the retainer frame comprises a material selected from the group consisting of plastic, metal, and polycarbonate.

18. The demountable heat spreader assembly of claim 14 further comprising a secondary heat exchanger disposed on the heat spreader and in thermal communication with the heat spreader.

19. The demountable heat spreader assembly of claim 18 further comprising a thermally conductive material disposed intermediate between the heat spreader and the secondary heat exchanger, the thermally conductive material in thermal communication with the heat spreader and the secondary heat exchanger.

20. The demountable heat spreader assembly of claim 18, wherein the secondary heat exchanger is selected from the group consisting of a heat pipe, a heat sink, a finned heat sink, a thermoelectric cooler, a cold plate, and a forced air cooled heat sink.

* * * * *